United States Patent
Moriyama et al.

(10) Patent No.: US 10,982,142 B1
(45) Date of Patent: Apr. 20, 2021

(54) RED PHOSPHOR AND LIGHT EMITTING DEVICE USING THE SAME

(71) Applicant: Panasonic Intellectual Property Management Co., Ltd., Osaka (JP)

(72) Inventors: Riho Moriyama, Osaka (JP); Shinnosuke Akiyama, Okayama (JP); Kei Toyota, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/033,682

(22) Filed: Sep. 26, 2020

(30) Foreign Application Priority Data

Oct. 3, 2019  (JP) .............................. JP2019-183018

(51) Int. Cl.
*C09K 11/77* (2006.01)
*H01L 33/50* (2010.01)
*F21V 9/30* (2018.01)
*H01L 33/00* (2010.01)

(52) U.S. Cl.
CPC ............ *C09K 11/7718* (2013.01); *F21V 9/30* (2018.02); *H01L 33/0004* (2013.01); *H01L 33/504* (2013.01); *H01L 2933/0041* (2013.01)

(58) Field of Classification Search
CPC .............. C09K 11/7718; H01L 33/504; H01L 33/0004; F21V 9/30
See application file for complete search history.

(56) References Cited

U.S. PATENT DOCUMENTS

| | | |
|---|---|---|
| 4,436,646 A | 3/1984 | Takahara et al. |
| 2004/0135504 A1 | 7/2004 | Tamaki et al. |
| 2006/0038477 A1 | 2/2006 | Tamaki et al. |
| 2008/0089825 A1 | 4/2008 | Tamaki et al. |
| 2009/0072708 A1 | 3/2009 | Tamaki et al. |
| 2009/0230840 A1 | 9/2009 | Tamaki et al. |
| 2009/0284132 A1 | 11/2009 | Tamaki et al. |
| 2009/0309485 A1 | 12/2009 | Tamaki et al. |

FOREIGN PATENT DOCUMENTS

| | | |
|---|---|---|
| JP | 58-059279 | 4/1983 |
| JP | 61-055186 | 3/1986 |
| JP | 2003-321675 | 11/2003 |
| JP | 2008-174621 | 7/2008 |

*Primary Examiner* — Joseph L Williams
(74) *Attorney, Agent, or Firm* — Wenderoth, Lind & Ponack, L.L.P.

(57) ABSTRACT

A red phosphor is expressed by a chemical formula of $Ca_zO:Ce_x, Li_y$, in which a range of x values is $0<x<0.2$, a range of y values is $0 \leq y < 0.2$, and a range of z values is $1-x-y \leq z \leq 1-x$.

2 Claims, 6 Drawing Sheets

FIG. 5

(Table 1)

| | $Ca_zO:Ce_x,Li_y$ | | | How to take z value | Formulation amount (g) | | | | Light emission characteristics evaluation in long wavelength region | | Light emission efficiency evaluation | | Compre-hensive judg-ment |
|---|---|---|---|---|---|---|---|---|---|---|---|---|---|
| | x | y | z | | $CeO_2$ | $Li_2O$ | CaO | $BaF_2$ | Light emission peak wave-length (nm) | Judg-ment | External quantum efficiency relative value (%) | Judg-ment | |
| Example 1 | 0.007 | 0.007 | 0.993 | 1-x | 0.422 | 0.073 | 19.505 | 2.000 | 572 | A | 1 | A | A |
| Example 2 | 0.007 | 0.007 | 0.986 | 1-x-y | 0.4249 | 0.074 | 19.501 | 2.000 | 570 | A | 0.86 | A | A |
| Example 3 | 0.007 | 0.007 | 0.99 | 1-x-y<z<1-x | 0.4232 | 0.073 | 19.503 | 2.000 | 571 | A | 0.90 | A | A |

FIG. 6

(Table 2)

| | $Ca_zO:Ce_x,Li_y$ | | | How to take z value | Formulation amount (g) | | | | Light emission spectrum evaluation | | Light emission efficiency evaluation | | Compre-hensive judg-ment |
|---|---|---|---|---|---|---|---|---|---|---|---|---|---|
| | x | y | z | | $CeO_2$ | $Li_2O$ | CaO | $BaF_2$ | Light emission peak wave-length (nm) | Judg-ment | External quantum efficiency relative value (%) | Judg-ment | |
| Example 4 | 0.190 | 0.190 | 0.800 | 1-x-y<z<1-x | 7.647 | 1.361 | 10.992 | 2.000 | 575 | A | 0.55 | A | A |
| Comparative example 1 | 0.000 | 0.007 | 0.993 | 1-x-y | 0.000 | 0.075 | 19.925 | 2.000 | — | B | — | B | B |
| Comparative example 2 | 0.200 | 0.190 | 0.800 | 1-x | 7.876 | 1.335 | 10.789 | 2.000 | 576 | A | 0.50 | B | B |

FIG. 7

(Table 3)

| | $Ca_zO:Ce_x,Li_y$ | | | How to take z value | Formulation amount (g) | | | | Light emission spectrum evaluation | | Light emission efficiency evaluation | | Judg-ment |
|---|---|---|---|---|---|---|---|---|---|---|---|---|---|
| | x | y | z | | $CeO_2$ | $Li_2O$ | CaO | $BaF_2$ | Light emission peak wave-length (nm) | Judg-ment | External quantum efficiency relative value (%) | Judg-ment | |
| Example 1 | 0.007 | 0.007 | 0.993 | 1-x | 0.422 | 0.073 | 19.505 | 2.000 | 572 | A | 1 | A | A |
| Example 5 | 0.007 | 0.000 | 0.993 | 1-x | 0.424 | 0.000 | 19.576 | 2.000 | 568 | A | 0.95 | A | A |
| Comparative example 3 | 0.007 | 0.200 | 0.993 | 1-x | 0.374 | 1.854 | 17.772 | 2.000 | 575 | A | 0.48 | B | B |

FIG. 8

(Table 4)

|  | 1/e light emission lifetime |
|---|---|
| Example 1 | 54ns |
| Example 2 | 55ns |
| Example 5 | 54ns |
| Comparative example 3 | 820ns |

RED PHOSPHOR AND LIGHT EMITTING DEVICE USING THE SAME

BACKGROUND

1. Technical Field

The present disclosure relates to a red phosphor that absorbs blue-based excitation light and emits red fluorescence, and a light emitting device using the red phosphor.

2. Description of the Related Art

A semiconductor light emitting element such as a light emitting diode (LED) has advantages that it is small in size, consumes less power, and can stably emit light with high brightness, and in recent years, there has been a movement to replace a lighting fixture such as an incandescent lamp with a lighting fixture that uses a light emitting device including an LED that emits white light. As an LED that emits white light, there is, for example, an LED in which a blue LED is combined with a Ce-activated YAG-based yellow phosphor expressed by a composition formula of $Y_3Al_5O_{12}:Ce$.

In the light emitting device having the configuration described above, white light is realized by mixing blue light of the LED and yellow light emitted from the Ce-activated YAG phosphor. In this configuration, the white light is pale white light due to light emission characteristics of the Ce-activated YAG phosphor. On the other hand, there is a strong demand for slightly reddish warm-colored white light for display lighting in stores, in medical field lighting and the like, and the light emitting device having the configuration described above is not suitable for emitting warm white light.

A light emitting device capable of emitting a reddish warm-colored white color by further combining an Eu-activated nitride-based red phosphor expressed by the composition formula of $Ca_2Si_5N_7:Eu$, in addition to the blue LED and the Ce-activated YAG-based phosphor, is disclosed (for example, see Japanese Patent Unexamined Publication No. 2003-321675).

It is disclosed that the configuration described in Japanese Patent Unexamined Publication No. 2003-321675 enables a light emitting device that emits white light that exhibits a high color rendering index (Ra), and particularly an excellent special color rendering index (R9) showing the appearance of red, at a color temperature of a light bulb color region of 3,250 K or less.

SUMMARY

According to one aspect of the present disclosure, there is provided a red phosphor of a chemical formula $Ca_zO:Ce_x,Li_y$, in which a range of values of x is $0<x<0.2$, a range of values of y is $0 \leq y<0.2$, and a range of values of z is $1-x-y \leq z \leq 1-x$.

BRIEF DESCRIPTION OF THE DRAWINGS

FIG. 5 is Table 1 showing values of x, y, z, formulation amounts of raw materials, evaluation results, and the like in red phosphors that can be expressed by $Ca_zO:Ce_x,Li_y$, of Examples 1 to 3;

FIG. 6 is Table 2 showing values of x, y, z, formulation amounts of raw materials, evaluation results, and the like in red phosphors that can be expressed by $Ca_zO:Ce_x,Li_y$, of Example 4 and Comparative Examples 1 and 2;

FIG. 7 is Table 3 showing values of x, y, z, formulation amounts of raw materials, evaluation results, and the like in red phosphors that can be expressed by $Ca_zO:Ce_x,Li_y$, of Example 1, Example 5, and Comparative Example 3; and FIG. 8 is Table 4 showing 1/e light emission lifetimes of Examples 1, 2, and 5 and Comparative Example 4.

DETAILED DESCRIPTIONS

Figure 1:
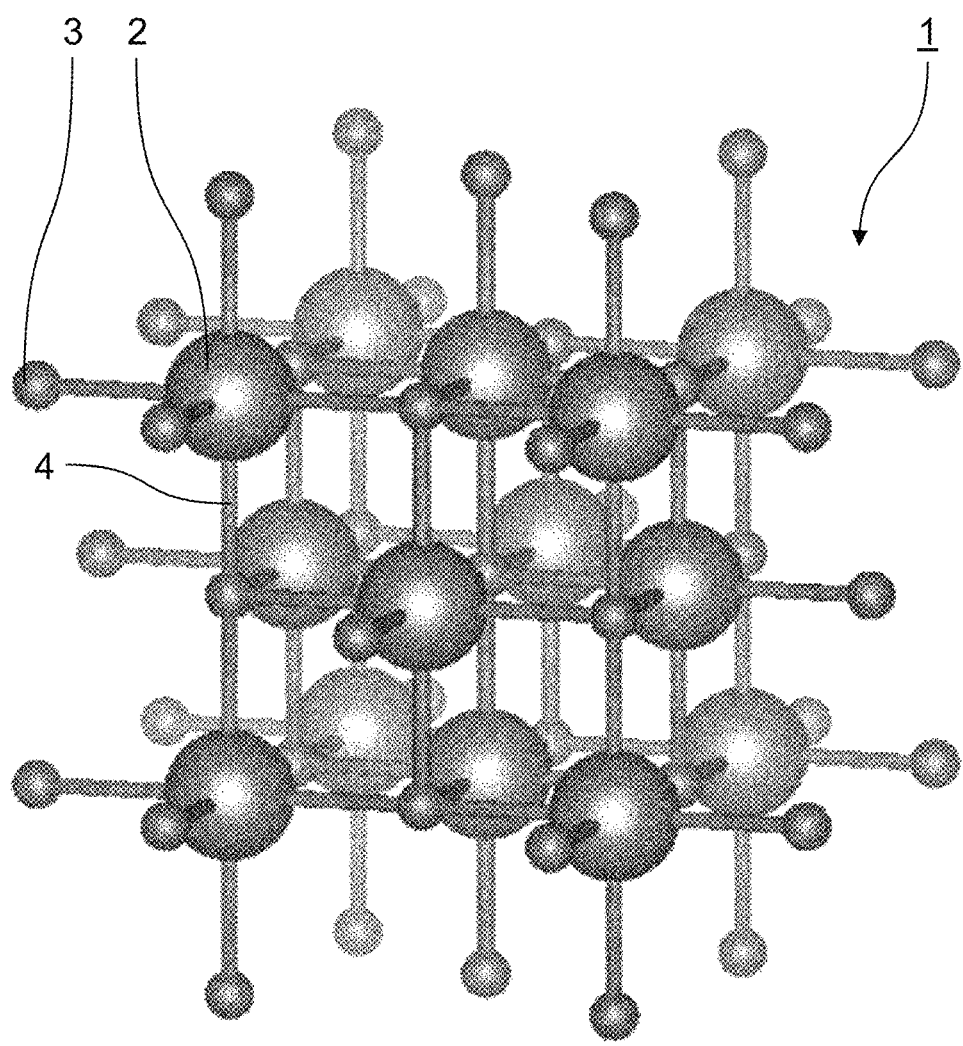
FIG. 1 is a schematic diagram of a crystal structure of a mother crystal of a red phosphor according to Embodiment 1.

In the red phosphor described in Japanese Patent Unexamined Publication No. 2003-321675, Eu having a long light emission lifetime is activated as a light emission center. For that reason, for example, when a high-power excitation light source such as a blue laser is applied as an excitation light source to realize a high-brightness, high-color-rendering light source, light emission brightness decreases due to brightness saturation under a high-power light source, and thus the brightness required for the device cannot be secured. In the future, it is considered that a red phosphor having light emission brightness compatible with a high-power light source will be required due to market needs such as higher brightness and higher color rendering property of a light source and a projector.

The present disclosure solves the related art problems described above, and an object thereof is to provide a red phosphor with little decrease in light emission brightness due to brightness saturation under a high-power light source.

According to a first aspect of the present disclosure, there is provided a red phosphor expressed by a chemical formula of $Ca_zO:Ce_x,Li_y$, in which a range of values of x is $0<x<0.2$, a range of values of y is $0 \leq y<0.2$, and a range of values of z is $1-x-y \leq z \leq 1-x$.

According to a second aspect of the present disclosure, there is provided a light emitting device including the red phosphor according to the first aspect and a light source having a light emission peak wavelength in a range of 400 nm to 500 nm, inclusive.

As described above, since the red phosphor according to the present disclosure has a configuration expressed by the chemical formula described above, the red phosphor has a light emission peak wavelength of 560 nm or more and 700 nm or less and exhibits a high color rendering property in a long wavelength region within a visible light region, and has a little decrease in light emission brightness under irradiation with a high-power light source. Accordingly, for example, a light emitting device having high brightness and high color rendering can be obtained by combining a light source emitting blue light and having a light emission peak wavelength of 450 nm with the red phosphor according to the present disclosure.

Hereinafter, a red phosphor according to an exemplary embodiment will be described with reference to the accompanying drawings. In the drawings, substantially the same members are designated by the same reference numerals.

EMBODIMENT 1

Red Phosphor

The red phosphor according to Embodiment 1 is expressed by the chemical formula of $Ca_zO:Ce_x,Li_y$, in which a range of values of x is $0<x<0.2$, a range of values of y is $0\leq y<0.2$, and a range of values of z is $1-x-y\leq z\leq 1-x$. In general, optical characteristics of phosphor are determined by a type of mother crystal and light emission center. For example, $Y_3Al_5O_{12}:Ce$, which is generally known as a yellow phosphor, has a mother crystal of $Y_3Al_5O_{12}$ crystal having a garnet structure, and a light emission center thereof is Ce. FIG. 1 illustrates a schematic diagram of a crystal structure of a mother crystal of the red phosphor according to Embodiment 1. The mother crystal of the red phosphor according to Embodiment 1 is CaO crystal 1 having a rock salt type structure, and the light emission center of the red phosphor is Ce. In CaO crystal 1, a site containing Ca is called Ca site 2, a site containing O is called O site 3, and a space between Ca site 2 and O site 3 is called interstitial 4. Three types of structures can be considered for the red phosphor according to Embodiment 1. The first type is the case where all Ce are replaced by Ca sites 2 and all Li are replaced by Ca sites 2, that is, a value of z is $z=1-x-y$. The second type is the case where all Ce is replaced by Ca sites 2 and all Li exists in interstitial 4, that is, $z=1-x$. The third type is the case where all Ce are replaced by Ca sites 2, some Li are replaced by Ca sites 2, and all the remaining Li exists in interstitial 4, that is, the value of z is $1-x-y<z<1-x$.

In the chemical formula described above, the value of x is larger than 0 because Ce, which serves as the light emission center, needs to be included in order to obtain light emission. The value of x is preferably 0.0001 or more, and more preferably 0.003 or more from the viewpoint of increasing light emission intensity. There is no particular limitation on the maximum value of x as long as the red phosphor can emit light. However, when the value of x becomes too large, the light emission intensity will decrease due to concentration quenching. For that reason, a decrease in light emission intensity can be controlled by setting the value of x to be less than 0.2. The value of x is preferably 0.1 or less, more preferably 0.03 or less from the viewpoint of increasing the light emission intensity.

In order to obtain light emission, it is not always necessary to contain Li, but it is desirable to contain Li from the viewpoint of obtaining light emission on the longer wavelength side. There is no particular limitation on the maximum value of y as long as the red phosphor can emit light. However, when the value of y becomes too large, Li interferes with light emission of Ce and the light emission intensity is decreased. For that reason, it is possible to control the decrease in light emission intensity by setting the value of y to be less than 0.2.

In a case where the value of z is smaller than $1-x-y$, that is, the amount of Ca is less than the total amount of Ce and Li, when synthesized with such a formulation, Ce and Li are deposited as impurities in order to match the amount of Ca, and eventually the value of z becomes $1-x-y$ or more and a stable crystal structure is obtained. In a case where the value of z is larger than $1-x$, that is, the amount of Ca is greater than the amount of Ce, when synthesized with such a formulation, since there is no space for Ce to enter the Ca site 2, Ce is deposited as an impurity, and eventually the value of z becomes $1-x$ and a stable crystal structure is obtained. From the viewpoints described above, the value of z is in the range of $1-x-y\leq z\leq 1-x$.

Here, the light emission peak is a peak having the maximum value in the entire spectrum. The light emission peak appears when excited at a wavelength of 450 nm.

The 1/e light emission lifetime of the red phosphor according to Embodiment 1 may exhibit a value of 100 ns or less. The light emission lifetime affects brightness saturation characteristics. The red phosphor containing Eu, such as CASN:Eu, which is a red phosphor of the related art, has a larger light emission lifetime value, that is, a longer light emission lifetime than a red phosphor containing Ce. For that reason, the red phosphor containing Eu is likely to be saturated in brightness due to a decrease in quantum efficiency during high-power excitation. Accordingly, the red phosphor according to Embodiment 1 in which Ce is activated as a light emission center is promising as a red phosphor having high quantum efficiency even at high power, as compared with the red phosphor of the related art.

Method for Manufacturing Red Phosphor

Hereinafter, a method for manufacturing the red phosphor according to Embodiment 1 will be described.

(1) As the raw material, for example, an oxide of cerium (Ce), lithium (Li), and calcium (Ca), which are elements constituting a mother crystal and an activator, can be used. Cerium oxide, calcium oxide, and lithium oxide are prepared as raw material oxides. The raw materials may be metal salt compounds such as carbonates instead of these oxides.

(2) Predetermined amounts of these powders are measured and mixed well. The mixing method may be wet mixing in a solution or dry mixing of dry powder. For the mixing, an industrially used ball mill, medium stirring mill, planetary mill, vibration mill, jet mill, stirrer or the like can be used. It is also possible to carry out the mixing manually using a mortar or the like. Barium fluoride ($BaF_2$) or strontium fluoride ($SrF_2$) may be mixed as a flux in an amount corresponding to 0.1 to 10 wt % of the mixed powder.

(3) Next, the mixed powder prepared as described above is baked. For the baking, for example, an electric furnace can be used. For example, the mixed powder is put into an alumina crucible and heated together with the alumina crucible at 1200° C. or higher and 1600° C. or lower for a time of about 3 hours to 12 hours and baked.

(4) After baking, the red phosphor powder can be obtained by cooling, crushing, and if necessary, through steps such as flux washing with an acid.

EMBODIMENT 2

Light Emitting Device

Figure 3:
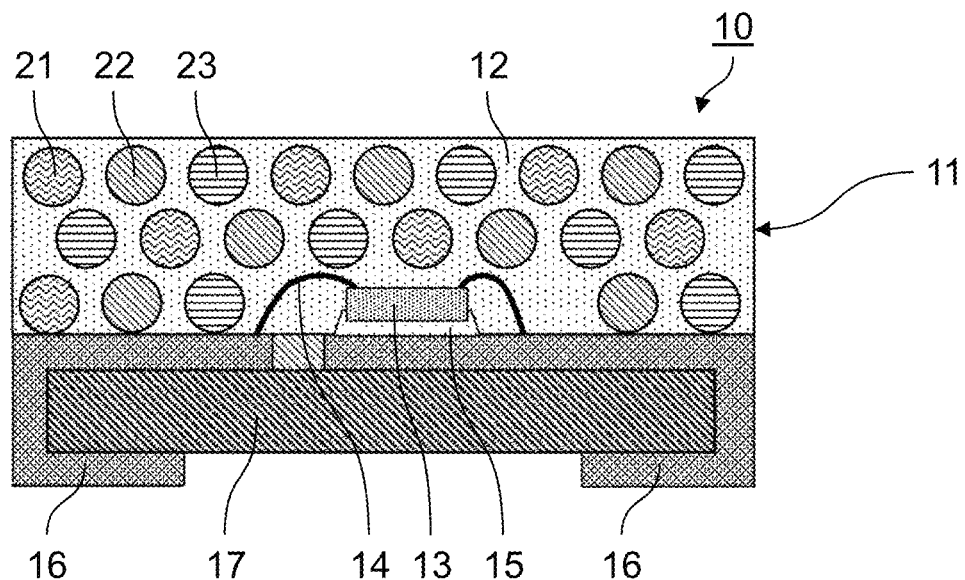
FIG. 3 is a schematic cross-sectional view of an LED light emitting device according to Embodiment 2.

In Embodiment 2, as an example of the light emitting device of the present disclosure, an LED light emitting device including the red phosphor according to Embodiment 1 and an LED chip as a light source will be described. FIG. 3 is a schematic cross-sectional view illustrating an embodiment of the LED light emitting device according to Embodiment 2. As illustrated in FIG. 3, LED light emitting device 10 includes LED wavelength conversion member 11 and LED chip 13. LED light emitting device 10 may include support 17. Support 17 supports LED chip 13. In this embodiment, since LED light emitting device 10 has a structure capable of surface mounting, support 17 is a board. LED wavelength conversion member 11 includes at least red phosphor 21 and LED sealant 12.

The LED light emitting device according to Embodiment 2 can be used for a high-brightness LED light emitting device.

The members constituting the LED light emitting device will be described below.

Support

Support 17 has a high thermal conductivity so that heat generated in LED chip 13 can be efficiently radiated to the outside, for example. For support 17, for example, a ceramic board made of alumina, aluminum nitride, or the like can be used.

LED Chip

As LED chip 13, for example, one that emits light in a region extending from the lower end of the ultraviolet region to yellow region, that is, one that has a peak of the light emission spectrum in the wavelength region of 400 nm to 500 nm is used. As LED chip 13, specifically, a blue LED chip or the like is used. LED chip 13 is fixed to support 17 by solder 15 or the like so that an emission surface does not come into contact with support 17 on support 17. LED chip 13 is electrically connected to electrode 16 provided on support 17 by bonding wire 14. LED chip 13 is covered with LED sealant 12.

LED Wavelength Conversion Member

LED wavelength conversion member 11 is configured by using LED sealant 12. Silicone resin is used for LED sealant 12. The silicone resin contains, for example, dimethyl silicone, which has high discoloration resistance. Methylphenyl silicone or the like having high heat resistance can also be used as the silicone resin. The silicone resin may be a homopolymer having a main skeleton with a siloxane bond defined by one type of chemical formula. The silicone resin may be a copolymer containing a structural unit having a siloxane bond defined by two or more types of chemical formulas, or an alloy of two or more types of silicone polymers.

LED wavelength conversion member 11 includes a phosphor. The phosphor converts light emitted from LED chip 13 into light having a longer wavelength. The phosphor contained in LED wavelength conversion member 11 is configured by mixing red phosphor 21 and at least one of yellow phosphor 22 and green phosphor 23. As red phosphor 21, the red phosphor according to Embodiment 1 is used. As yellow phosphor 22, for example, $Y_3Al_5O_{12}$:Ce, α-SiAlON:Eu, or the like can be used. As green phosphor 23, $Ca_3SiO_4C_2$:Eu, β-SiAlON:Eu, or the like can be used. In this embodiment, in particular, a case where LED wavelength conversion member 11 is configured by mixing three types of red phosphor 21, yellow phosphor 22, and green phosphor 23 will be described. A mixing ratio of the three types of phosphors can be appropriately adjusted according to a desired color tone of white light, light emission intensity of each phosphor, and the like. The three types of phosphors of red phosphor 21, yellow phosphor 22, and green phosphor 23 are contained in LED sealant 12 at a ratio of 3 parts by weight or more and 70 parts by weight or less with respect to 100 parts by weight of the sealant, for example. When the content is less than 3 parts by weight, sufficient intensity of fluorescence cannot be obtained, and thus LED light emitting device 10 that emits light of a desired wavelength may not be realized. A weight ratio of the three types of phosphors can be appropriately determined depending on the desired color tone of white light and light emission intensity of each phosphor.

LED light emitting device 10 can be configured as LED light emitting device 10 that emits a color other than white by combining red phosphor 21 and the phosphors of other colors.

Yellow phosphor 22 and green phosphor 23 other than red phosphor 21 according to Embodiment 1 can be manufactured according to known methods.

EMBODIMENT 3

Light Emitting Device

Figure 4:
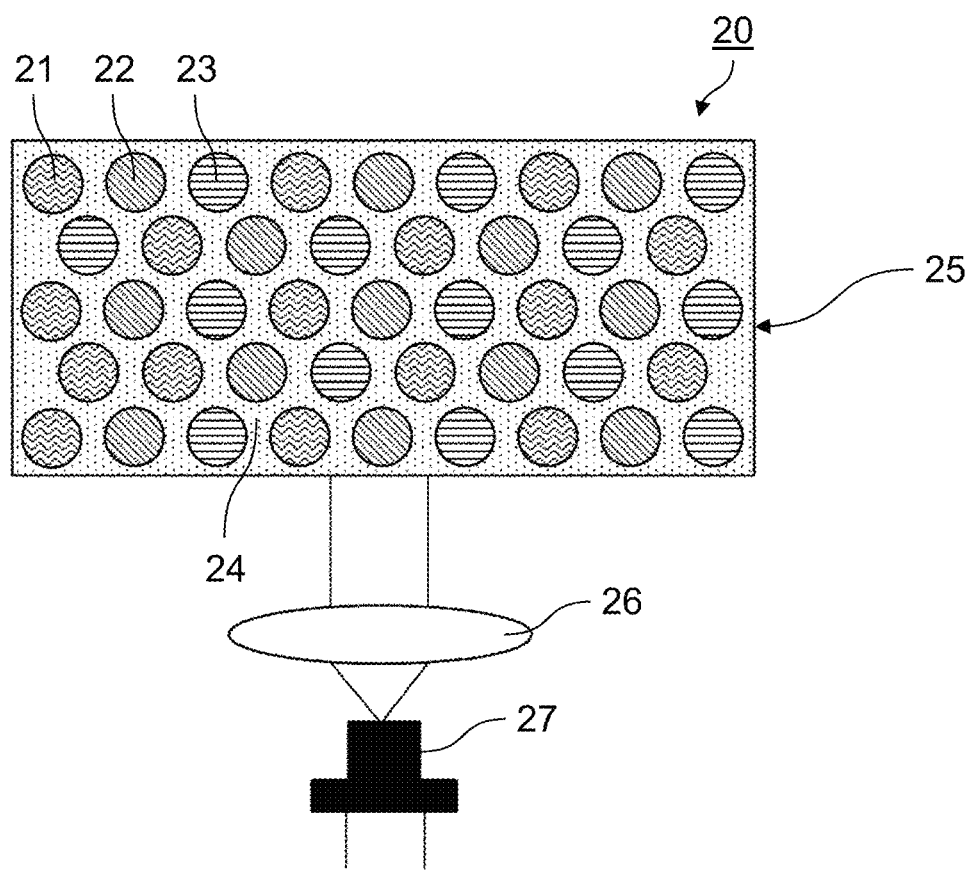
FIG. 4 is a schematic cross-sectional view of an LD light emitting device according to Embodiment 3.

In Embodiment 3, as an example of the light emitting device of the present disclosure, an LD light emitting device including the red phosphor according to Embodiment 1 and an LD element as a light source will be described. FIG. 4 illustrates a schematic configuration of LD light emitting device 20 according to Embodiment 3. LD light emitting device 20 includes LD element 27 and LD wavelength conversion member 25. LD wavelength conversion member 25 includes at least red phosphor 21 and binder 24.

The members constituting this LD light emitting device will be described below.

LD Element

LD element 27 can emit light having an optical power density higher than that of the LED. Thus, by using LD element 27, high-power LD light emitting device 20 can be configured.

The optical power density of LD element 27 is, for example, 0.5 W/mm$^2$ or more from the viewpoint of increasing the power of LD light emitting device 20. The optical power density may be 2 W/mm$^2$ or more, 3 W/mm$^2$ or more, and 10 W/mm$^2$ or more. On the other hand, if the optical power density is too high, an amount of heat generated from the phosphor irradiated with light increases, which may adversely affect LD light emitting device 20. Thus, the optical power density may be 150 W/mm$^2$ or less, 100 W/mm$^2$ or less, 50 W/mm$^2$ or less, and 20 W/mm$^2$ or less.

As LD element 27, for example, one that emits light in a region extending from the lower end of the ultraviolet region to yellow region, that is, one that has a peak of the light emission spectrum in the wavelength region of 400 nm to 500 nm is used. For example, an LD element that emits blue-violet light or an LD element that emits blue light can be used. In this embodiment, the case where LD element 27 emits blue light will be described.

LD Wavelength Conversion Member

LD wavelength conversion member 25 is configured by using binder 24. Binder 24 is a medium such as a resin, glass, or transparent crystal. Binder 24 may be a single material or may be a different material depending on the location.

LD wavelength conversion member 25 contains a phosphor. The phosphor converts light emitted from LD element 27 into light having a longer wavelength. The phosphor of LD wavelength conversion member 25 is configured by mixing red phosphor 21 and at least one of yellow phosphor 22 and green phosphor 23. As red phosphor 21, the red phosphor according to Embodiment 1 is used. As yellow phosphor 22 and green phosphor 23, those phosphors exemplified in Embodiment 2 can be used. In this embodiment, the case where LD wavelength conversion member 25 is configured by mixing three types of red phosphor 21, yellow phosphor 22, and green phosphor 23 is particularly described. The mixing ratio of the three types of phosphors can be appropriately adjusted according to the desired color tone of white light, the light emission intensity of each phosphor, and the like.

Blue light emitted from LD element 27 passes through incident optical system 26 and is converted into red light, yellow light, and green light by red phosphor 21, yellow phosphor 22, and green phosphor 23 in LD wavelength conversion member 25, respectively. White light is obtained by mixing blue light, which is emitted from LD element 27 and is not absorbed by the three types of phosphors described above, and red light, yellow light, and green light that are converted by red phosphor 21, yellow phosphor 22, and green phosphor 23, respectively.

As described above, according to the light emitting devices of Embodiments 2 and 3, since the red phosphor according to Embodiment 1 is used, it is possible to improve the quantum efficiency at high power as compared with the light emitting device of the related art. Furthermore, when configured as a white light emitting device, high color rendering and color reproducibility can be realized.

Hereinafter, Examples and Comparative Examples will be specifically described.

EXAMPLE 1

(1) As raw materials, 0.422 g of cerium oxide powder ($CeO_2$), 0.073 g of lithium oxide powder ($Li_2O$), 19.505 g of calcium oxide powder (CaO), and 2.000 g of barium fluoride powder ($BaF_2$) are weighed in one container. Barium fluoride is a flux.

(2) These raw materials are mixed thoroughly. For mixing, a device such as a ball mill can be used.

(3) The mixture is put into an alumina crucible and baked at 1400° C. in an electric furnace at atmospheric pressure for about 3 hours.

Figure 2:
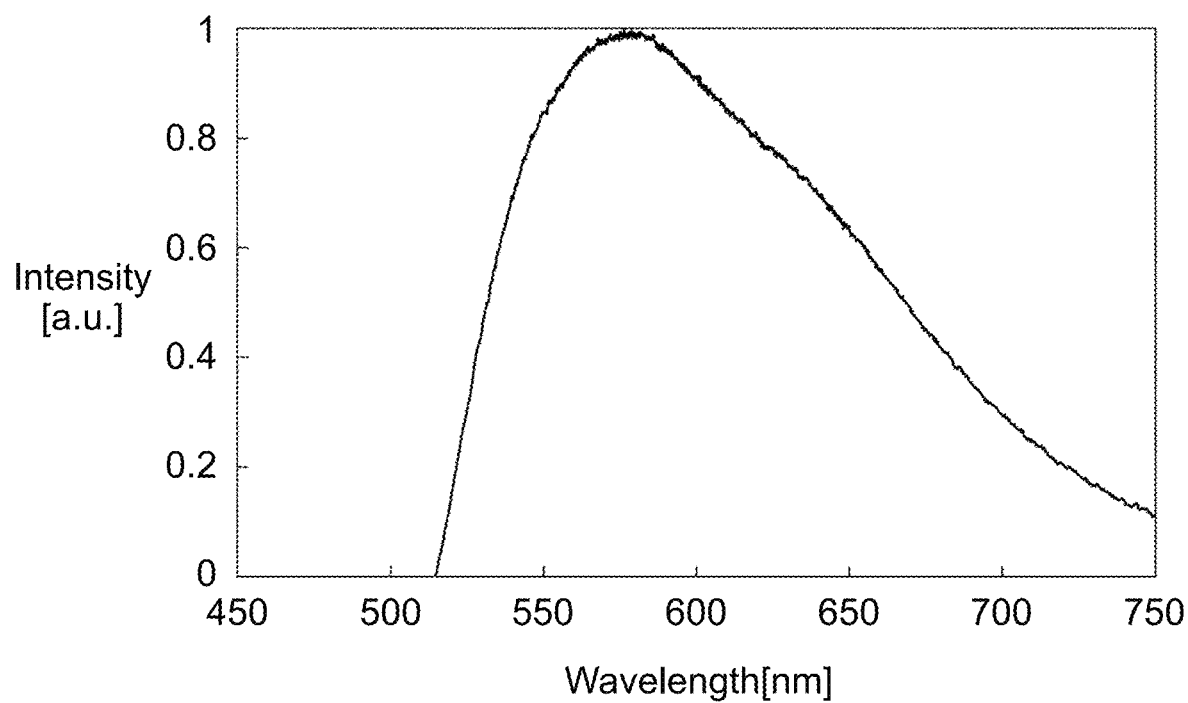
FIG. 2 is a light emission spectrum of a red phosphor of Example 1 according to Embodiment 1.

By doing as described above, in the red phosphor according to Example 1, the red phosphor having the light emission spectrum illustrated in FIG. 2 and expressed by the chemical formula $Ca_{0.993}O:Ce_{0.007}, Li_{0.007}$ can be obtained. Examples 2 to 5 and Comparative Examples 1 to 3

FIG. 5 is Table 1 showing values of x, y, and z, formulation amounts of the raw materials, evaluation results, and the like in the red phosphors that can be expressed by $Ca_zO:Ce_x, Li_y$ of Examples 1 to 3. FIG. 6 is Table 2 showing values of x, y, and z, formulation amounts of the raw materials, evaluation results, and the like in the red phosphors that can be expressed by $Ca_zO:Ce_x, Li_y$ of Example 4 and Comparative Examples 1 and 2. FIG. 7 is Table 3 showing values of x, y, and z, formulation amounts of the raw materials, evaluation results, and the like in the red phosphors that can be expressed by $Ca_zO:Ce_x, Li_y$ of Example 1, Example 5, and Comparative Example 3.

Examples 2 to 5 and Comparative Examples 1 to 3 are the same as Example 1 except that the raw materials were manufactured according to the formulation shown in Table 1 of FIG. 5, Table 2 of FIG. 6, and Table 3 of FIG. 7 and the respective values of x, y, and z in the red phosphor that can be expressed by the chemical formula of $Ca_zO:Ce_x, Li_y$ are shown in Table 1 of FIG. 5, Table 2 of FIG. 6, and Table 3 of FIG. 7.

Evaluation of Light Emission Characteristics in Long Wavelength Region (560 to 700 nm)

The light emission spectrum of Examples 1 to 5 and Comparative Examples 1 to 3 were measured by using a spectrofluoro-photometer using an integrating sphere. The synthesized red phosphor was placed at a predetermined position in the integrating sphere, and the powder was irradiated with blue light emitted from the blue LED light source attached to a measuring device, and the light emission spectrum was measured.

Judgment Criteria

In the light emission spectrum, those having a light emission peak wavelength of 560 nm or more and 700 nm or less were regarded as "A" as having excellent light emission characteristics in the long wavelength region.

In the light emission spectrum, those having a light emission peak wavelength of less than 560 nm were regarded as "B" as having insufficient light emission characteristics in the long wavelength region.

Evaluation of Light Emission Efficiency

External quantum efficiencies of Examples 1 to 5 and Comparative Examples 1 to 3 were measured using the spectrofluoro-photometer. The method is the same as above.

Judgment Criteria

Since the external quantum efficiency of Example 1 showed the highest value, a relative value when Example 1 was used as the reference of the external quantum efficiency was evaluated as the light emission efficiency. The relative value was calculated by dividing the value of the external quantum efficiency of each Example by the value of the external quantum efficiency of Example 1. When the relative value is 0.5 or less, light emission of the red phosphor is weak, and thus if the red phosphor is irradiated with the light source of the light emitting device, light emission from the light source becomes strong and color rendering cannot be ensured. Therefore, the judgment criteria are set as follows.

In a case where the relative value when the value of the external quantum efficiency of Example 1 is used as the reference is larger than 0.5, the judgment was set to "A" as having a range of high light emission efficiency.

In a case where the relative value when the value of the external quantum efficiency of Example 1 is used as the reference is 0.5 or less, the judgment was set to "B" as having a range of low light emission efficiency.

Comprehensive Judgment Criteria

In Examples 1 to 5 and Comparative Examples 1 to 3, comprehensive judgment was performed in consideration of both the light emission characteristics in the long wavelength region and the judgment of the evaluation of light emission efficiency.

When the judgment of the light emission characteristics in the long wavelength region was "A" and the judgment of the light emission efficiency was "A", the red phosphor was regarded as having excellent light emission characteristics and light emission efficiency in the long wavelength region, and the comprehensive judgment was set to "A".

In a case other than the case described above, that is, when the judgment of one of the light emission spectrum and the light emission efficiency is "B", it was regarded that the function as the red phosphor cannot be sufficiently exerted when the red phosphor was mounted on the light emitting device, and the comprehensive judgment was set to "B".

The following can be said from Examples 1, 2 and 3 shown in Table 1 of FIG. 5.

In the red phosphor that can be expressed by the chemical formula of $Ca_zO:Ce_x,Li_y$, it can be said that the value of z is $1-x-y \leq z \leq 1-x$, and the red phosphor has excellent light emission characteristics and light emission efficiency in the wavelength region.

The following can be said from Example 4 and Comparative Examples 1 and 2 shown in Table 2 of FIG. 6.

In the red phosphor that can be expressed by the chemical formula of $Ca_zO:Ce_x,Li_y$, it can be said that the range of x value is $0<x<0.2$, and the red phosphor has excellent light emission characteristics and light emission efficiency in the wavelength region. When x=0, that is, when Ce is not contained, it cannot be a phosphor because light emission center does not exist.

The following can be said from Examples 1 and 5 and Comparative Example 3 shown in Table 3 of FIG. 7.

In the red phosphor that can be expressed by the chemical formula of $Ca_zO:Ce_x,Li_y$, it can be said that the range of y value is $0 \leq y < 0.2$, and the red phosphor has excellent light emission characteristics and light emission efficiency in the wavelength region.

COMPARATIVE EXAMPLE 4

(1) $Ca_3N_2$ powder, $Si_3N_4$ powder, AlN powder, and EuN powder were prepared as starting raw materials.

(2) $Ca_3N_2$ powder, $Si_3N_4$ powder, AlN powder, and EuN powder were weighed so as to have a composition expressed by the general formula $Ca_{0.97}Eu_{0.03}AlSiN_3$, and these powders were mixed. As a mixing method, dry mixing using a mortar was performed in a glove box under a nitrogen atmosphere.

(3) The mixed raw material powder was put into a crucible made of boron nitride. This raw material powder was baked at 1600° C. for 2 hours in a nitrogen atmosphere.

(4) The baked sample was washed in a nitric acid solution having a concentration of 10% for 1 hour.

By the method described above, Comparative Example 4 expressed by CASN:Eu was prepared.

Evaluation of Light Emission Lifetime

The light emission lifetimes of Examples 1, 2, and 5 and Comparative Example 4 were measured with a light emission lifetime measuring device (manufactured by Hamamatsu Photonics). Table 4 of FIG. 8 shows 1/e light emission lifetimes of Examples 1, 2, and 5 and Comparative Example 4.

It was found that the 1/e light emission lifetimes of Examples 1, 2, and 5 were about 50 ns, showing a value of 100 ns or less. It is known that the 1/e light emission lifetime of Ce is generally 10 ns to 100 ns. Therefore, it is considered that light emission obtained from Examples 1, 2, and 5 is derived from Ce.

On the other hand, the 1/e light emission lifetime of CASN:Eu, which is Comparative Example 4, was 820 ns. Light emission lifetime affects brightness saturation. It is known that, as compared with the red phosphor containing Ce, the red phosphor containing Eu is likely to be saturated in brightness due to a decrease in quantum efficiency during high-power excitation. The red phosphors containing Ce of Examples 1, 2, and 5 are considered to be less likely to be saturated brightness because the light emission lifetime value thereof is significantly smaller than that of CASN:Eu, and therefore, the red phosphors of Examples 1, 2, and 5 can be combined with a high-power excitation light source to realize a high-power light emitting device.

In the present disclosure, appropriate combinations of any of the various embodiments and/or examples described above are included, and the effects exerted by the respective embodiments and/or examples can be achieved.

The red phosphor according to the present disclosure is a red phosphor having a light emission peak wavelength in the range of 560 nm or more and 700 nm or less, a large amount of light emission in a long wavelength region, and capable of suppressing a decrease in light emission rate under irradiation with a high-power light source. When this red phosphor is applied to a light source emitting blue light, it can be used as a light emitting device excellent in high color rendering, can be suitably used as a light source for lighting, and has high industrial utility value.

What is claimed is:

1. A red phosphor of a chemical formula $Ca_zO:Ce_x,Li_y$, wherein a range of values of x is $0 < x < 0.2$, a range of values of y is $0 \leq y < 0.2$, and a range of values of z is $1-x-y \leq z \leq 1-x$.

2. A light emitting device comprising:
   the red phosphor of claim 1; and
   a light source having a light emission peak wavelength in a range of 400 nm to 500 nm, inclusive.

* * * * *